United States Patent
Jacobson et al.

(10) Patent No.: US 6,389,491 B1
(45) Date of Patent: May 14, 2002

(54) TEST INSTRUMENTATION I/O COMMUNICATION INTERFACE AND METHOD

(75) Inventors: Eric Michael Jacobson, Loveland; Paul Faust, Ft. Collins, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/275,276

(22) Filed: Mar. 23, 1999

(51) Int. Cl.[7] .......................... G05F 13/14; G05F 13/20
(52) U.S. Cl. ..................... 710/62; 710/8; 710/10; 710/72; 709/302; 709/303; 712/15
(58) Field of Search .................. 710/8, 10, 72, 710/62; 712/15; 709/302, 303

(56) References Cited

U.S. PATENT DOCUMENTS

| | | | | |
|---|---|---|---|---|
| 5,353,401 A | * | 10/1994 | Iizawa et al. | 395/161 |
| 5,546,595 A | * | 8/1996 | Norman et al. | 395/800 |
| 5,606,702 A | * | 2/1997 | Diel et al. | 395/682 |
| 5,757,680 A | * | 5/1998 | Boston et al. | 364/579 |
| 6,112,278 A | * | 8/2000 | Ellis et al. | 711/118 |
| 6,249,825 B1 | * | 6/2001 | Sartore et al. | 710/8 |

* cited by examiner

*Primary Examiner*—Thomas Lee
*Assistant Examiner*—Rehana Perveen

(57) ABSTRACT

A universal I/O interface is presented which allows communication with a number of different instruments independent of the underlying I/O configuration. The universal I/O interface is a set of Component Object Model (COM) interfaces that are independent of the underlying I/O bus and API. In addition, the universal I/O interface allows instrument data to be parsed and instrument commands to be formatted in a programming language independent way. In the preferred embodiment, the universal I/O interface comprises an ActiveX Automation Server that abstracts the APIs for various possible underlying I/O buses and vendor software libraries into a single universal I/O interface. This allows instrument application programmers to design applications that are universally supported on any number of instrument I/O buses.

13 Claims, 8 Drawing Sheets

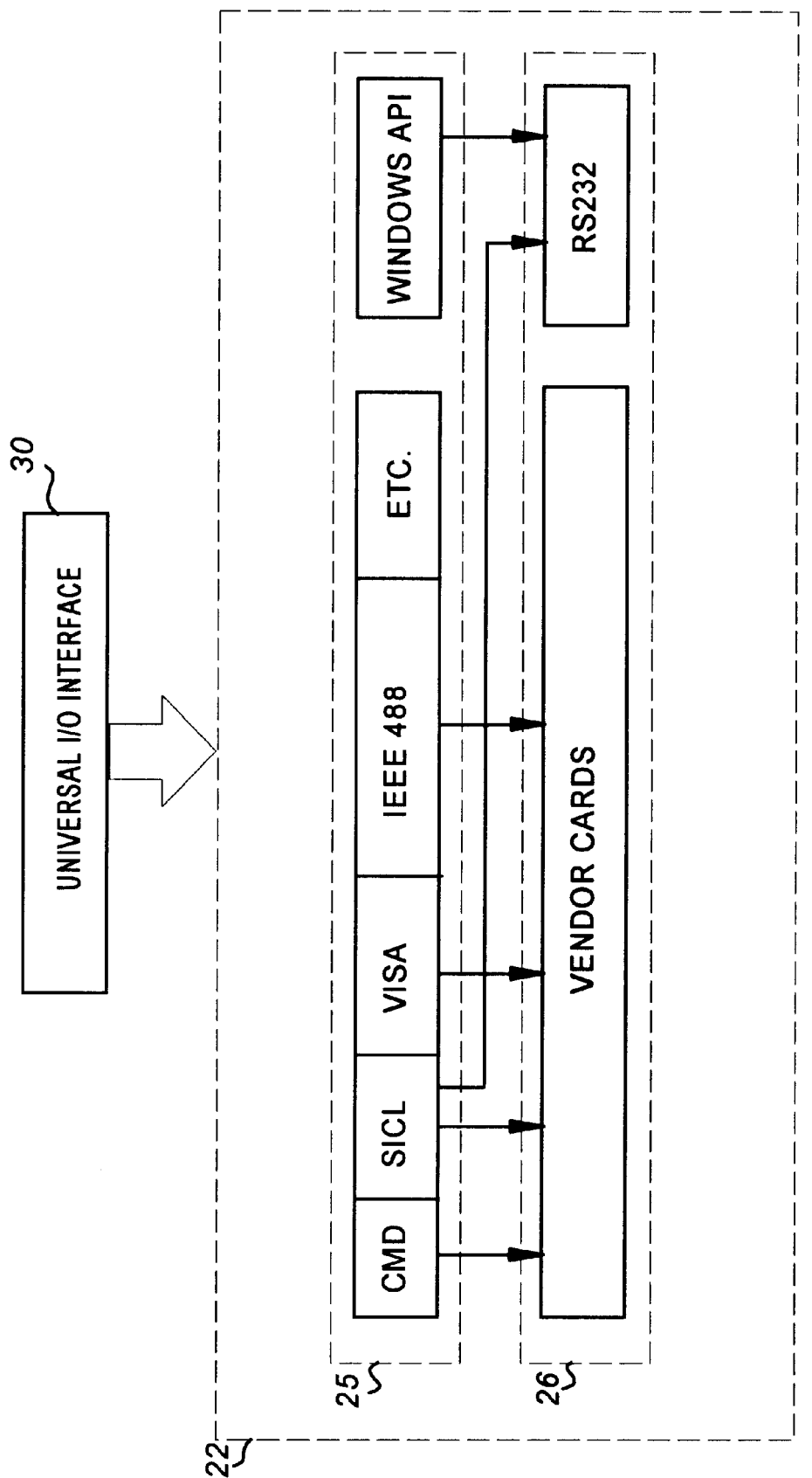

TEST INSTRUMENTATION I/O COMMUNICATION INTERFACE AND METHOD

REFERENCE OF COMPUTER PROGRAM LISTING APPENDICES

This application contains computer program listings attached as Appendix A, Appendix B, Appendix C, and Appendix D. These appendices have been submitted on a single compact disc (in duplicate) which contains Appendix A in a file named "09275276.APPENDIX A.txt" of size 6KB created on Feb. 5, 2002, Appendix B in a file named "09275276.APPENDIX B.TXT" OF SIZE 66 KB created on Feb. 5, 2002, Appendix C in a file named "09275276.APPENDIX C.txt" of size 3 KB created on Feb. 5, 2002, and Appendix D in a file named "09275276.APPENDIX D.txt" of size 12KB created on Feb. 5, 2002. The material contained in each of these files is hereby incorporated by reference.

FIELD OF THE INVENTION

The present invention pertains generally to test and measurement instrumentation, and more particularly to a universal I/O interface which allows communication with an instrument over any one of a plurality of I/O interfaces.

BACKGROUND OF THE INVENTION

Automated control of instrument devices over I/O buses is prevalent in many test and measurement applications. Automated instrument control allows the instrument configuration and test setup and control to be performed via a computer rather than strictly manually. Automated instrument control is useful in many situations, including circumstances where the test controller and instrument are located remote from one another. When developing an instrument control application, a test and measurement engineer must consider many factors in order to obtain successful communication between the application and instrument. These include the choice of data transport mechanism (i.e., I/O bus and associated controller), instrument drivers, I/O software libraries, and the language in which the application is written. To complicate matters, it is not uncommon for test and measurement applications to use a mix of I/O buses (e.g., VXI and GPIB, or RS-232 and GPIB, etc). Once the underlying I/O bus is chosen, the engineer must then select from a set of available vendors that support the chosen bus. Each vendor may, and typically do, support the bus using different Application Programmer Interfaces (API), thereby requiring the user to learn a different API each time a new vendor is selected.

I/O bus architecture options and available vendors continually change as technology progresses. As just described, each I/O bus defines a different API, which adds complexity to the system and costs valuable engineering time to learn. Accordingly, a need exists for a method for migrating from one bus architecture and/or vendor to another without incurring the overhead associated with learning a new API whenever the I/O solution is changed. In particular, a need exists for a mechanism and method to abstract the I/O type and vendor library and to provide only a single user/client API regardless of the selected I/O type and vendor library.

SUMMARY OF THE INVENTION

The present invention solves the problems of the prior art by providing a universal I/O interface that allows communication with a number of different instruments independent of the underlying I/O configuration. The universal I/O interface is a set of Component Object Model (COM) interfaces that are independent of the underlying I/O bus and API. In addition, the universal I/O interface allows instrument data to be parsed and instrument commands to be formatted in a programming language independent way. In the preferred embodiment, the universal I/O interface comprises a COM object known in the art as an ActiveX Automation Server that abstracts the APIs for various possible underlying I/O buses and vendor software libraries into a single universal I/O interface. This allows instrument application programmers to design applications that are universally supported on any number of instrument I/O buses.

BRIEF DESCRIPTION OF THE DRAWINGS

The invention will be better understood from a reading of the following detailed description taken in conjunction with the drawing in which like reference designators are used to designate like elements, and in which:

FIG. 3(*b*) is a COM object diagram of the universal I/O interface of the invention;

FIG. 6(*b*) is an operational flowchart of a method for instantiating an universal I/O interface automation server that supports the underlying I/O bus.

DETAILED DESCRIPTION

A novel universal I/O interface which allows communication with instrumentation over a choice of a variety of I/O busses and vendor supported software libraries is described in detail hereinafter. Although the invention is described in the context of Component Object Module (COM) objects, it is to be understood that the principles of the invention may be applied to any type of objects that support multiple interface specifications for allowing communication with instruments over a variety of data transport solutions regardless of the underlying I/O buses, associated software libraries, and the language that the object is written in.

Figure 1:
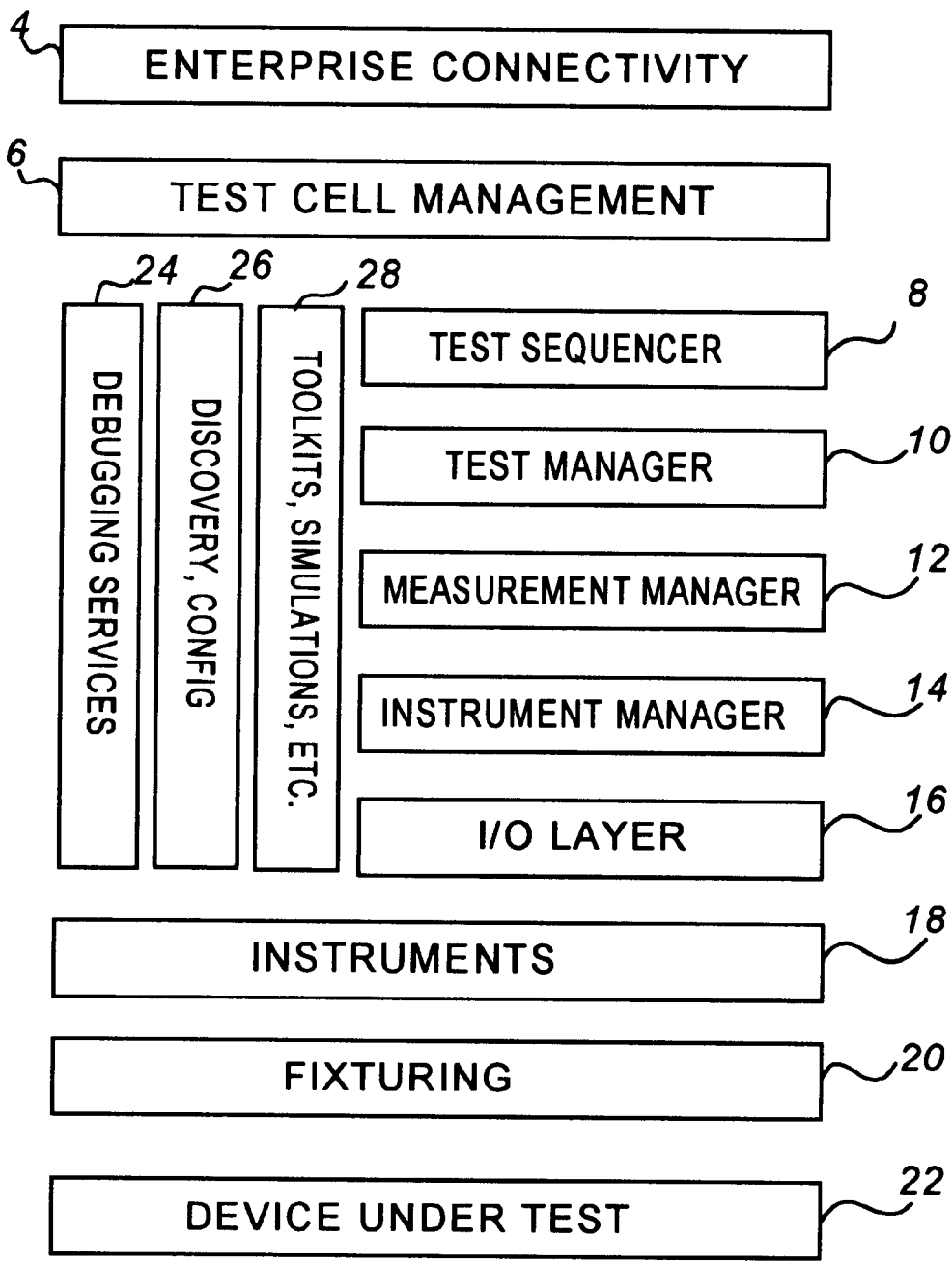
FIG. 1 is a high-level architecture diagram of a model of a typical test system.

FIG. 1 is a high-level architecture diagram of a model of a typical instrument test system 2. In this model, test system 2 includes an enterprise connectivity module 4 which implements the communication interface between the test system 2 and external devices such as a dedicated test monitoring computer (not shown). Test Cell Management Module 6 implements the operating system of the tester. Test Sequencer Module 8 manages the scheduling of tests, and Test Manager Module 10 implements the code that actually executes a test. During the execution of a test, instrument 18 is used to stimulate the device under test 22 and measurements are made by the instrument 18. Measurement Manager Module 12 receives measurements made by the instrument 18 and performs any manipulation and/or processing of the received measurements for use by the Test Manager Module 10. Measurements are obtained via the Instrument Manager Module 14, also known as and hereinafter referred to as an instrument driver. Instrument driver 14 communicates with the instrument 18 via an I/O layer 16, which typically receives instrument instructions from the instrument driver 14 over an I/O bus (not shown). I/O layer 16 decodes the instrument instructions and sends command signals to the instrument 18 which direct the instrument to perform the actions associated with the received instrument instructions. In this model, the instrument 18 is electrically connected to a fixture 20 which connects to a device under test 22 from which measurements are obtained and used in the execution of the test.

A Debugging Services Module 24, Discovery/Configuration Module 26, and/or Toolkit/Simulation Module 28 are also optionally included in the test system 2 to respectively allow test debugging, test setup query and configuration, and test simulation.

Figure 2:
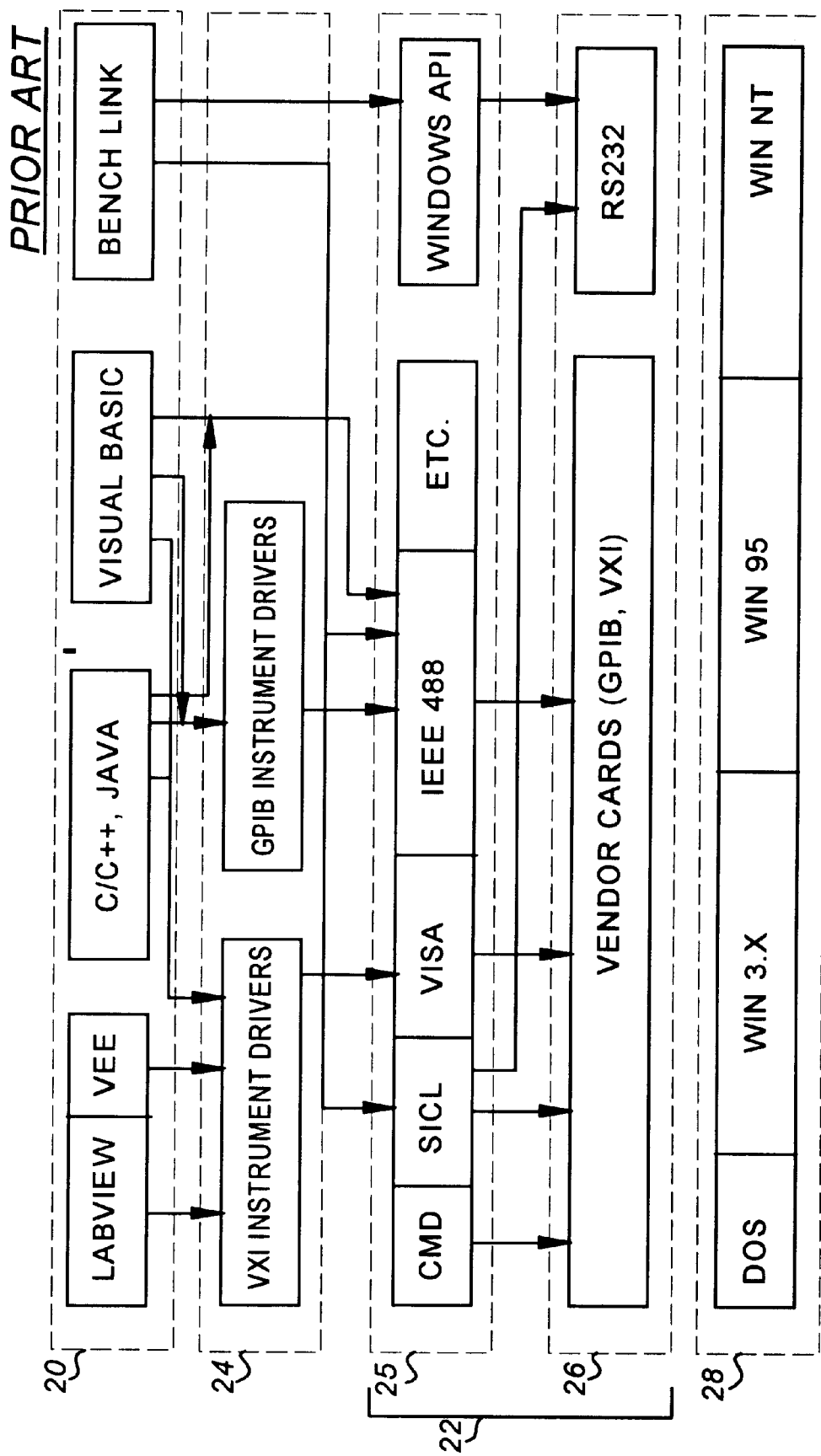
FIG. 2 is a diagram of an instrument-to-user I/O model.

FIG. 2 is a diagram of an instrument-to-user I/O model illustrating only a sample of the number of choices in application language 20, instrument drivers 24, I/O software libraries 25, bus and controller hardware 26, and operating systems 28 open to a test engineer when designing an instrument application. As shown, a multitude of options exist for the test engineer in terms of the test language, instrument drivers, I/O APIs, underlying I/O bus, and operating system. For example, the I/O bus may be implemented using the well-known General Purpose Interface Bus (GPIB), VME extensions for Instrumentation (VXI), RS-232 interface, or any number of other I/O busses 26. The I/O bus 26 may or may not be paired with I/O library software 25 which allows for easier control of the underlying I/O bus 26 by application programmers. Furthermore, the language 20 that an application is written in may vary depending on the application and computer system on which the application is executed. For example, the application may be written in LabView which communicates with the underlying hardware 26 via an instrument driver 24. Alternatively, the application may be implemented in C or C++ and communicate directly with the underlying I/O hardware 26. Clearly, many options for implementing a remote instrument control solution exist.

FIG. 3(a) is a high-level block diagram illustrating the function of the invention. As shown, a universal I/O interface 30 abstracts the I/O functionality 22 (i.e., I/O type including I/O API 25 and vendor I/O card 26) so that the only one universal API 30 need be learned to execute all instrument application needs regardless of the underlying I/O functionality 22.

The preferred embodiment implements the universal I/O interface 30 using COM objects. COM defines a standard approach by which one piece of software supplies its services to another. COM objects are particularly suitable for the present invention for many reasons. First, COM objects provide true encapsulation and prevents clients from directly accessing an object's data. Second, COM objects are polymorphic which allows clients to treat different objects as if they were the same. Third, COM interfaces are immutable, which means once published, the interface is prohibited from being changed. This guarantees that users can count on the defined interface to perform its defined functions as specified by its published interfaces. Fourth, COM objects support multiple inheritance, which means COM objects can support multiple interfaces. In addition, COM supports three types of objects, including in-process (DLL), local (EXE running in a separate process on the same machine), and remote (DLL or EXE running on a different machine via Distributed COM, or DCOM). This enables COM objects to be easily applied across libraries, applications, system software, and networks. Accordingly, COM objects are ideal for application in the universal I/O interface 30 of the invention, which must provide both a hardware and interface language independent mechanism for allowing a user or client to work with the underlying instrument I/O configuration.

Figure 3B:
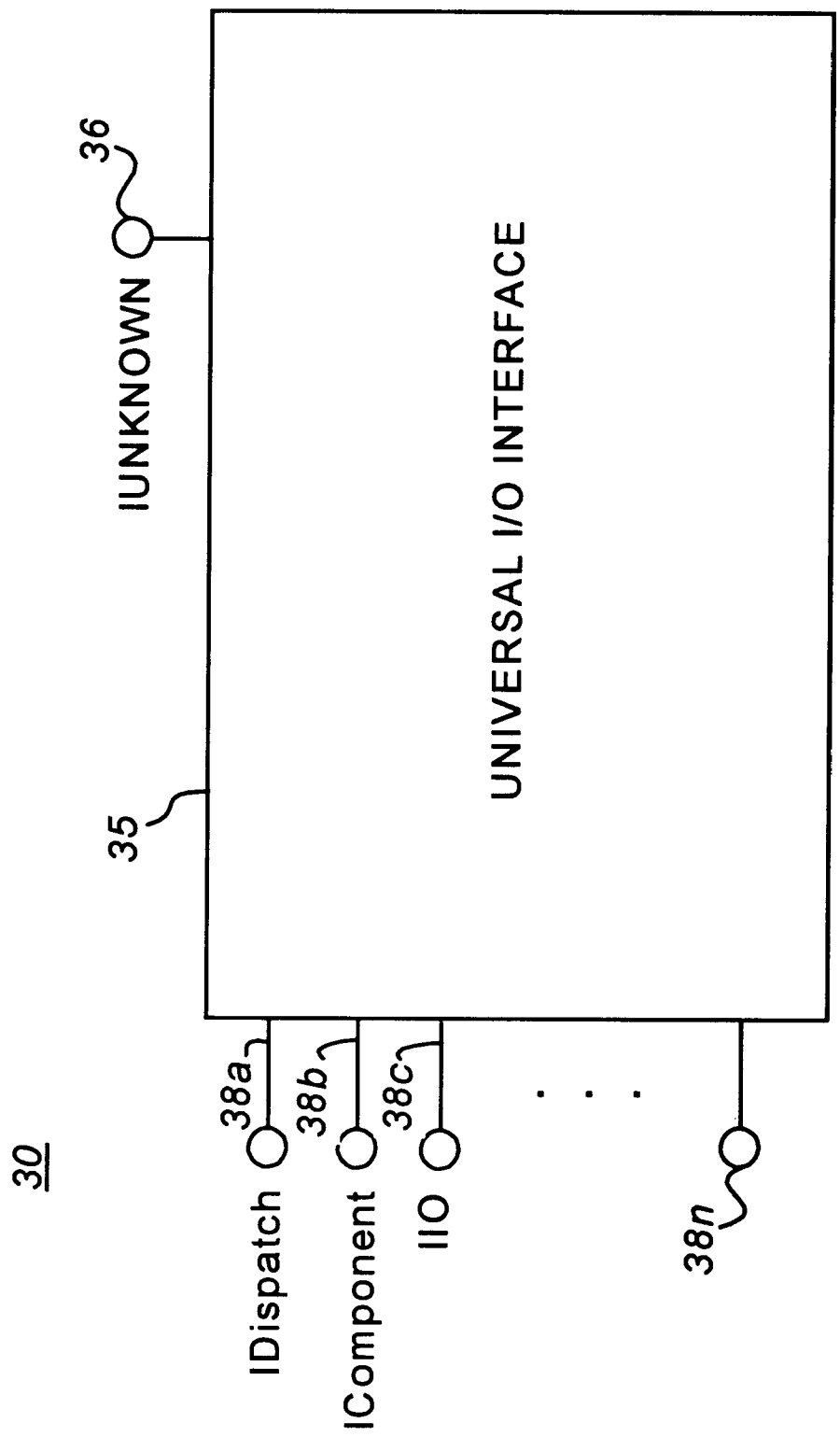
FIG. 3(*a*) is a high-level block diagram illustrating the function of the invention.

FIG. 3(b) is a COM object diagram of the universal I/O interface 30 of the invention. As illustrated, the COM object 35 implementing the universal I/O interface 30 comprises the standard IUnknown interface 36 and IDispatch interface 38a, and a plurality of custom defined interfaces 38b, . . . , 38n. Each custom defined interface 38b, . . . , 38n supports a set of methods specific to a different purpose. For example, universal I/O interface 30 preferably comprises the well-known IDispatch interface 38a, an IComponent interface 38b, and an IIO interface 38c. The IDispatch interface 38a is a well-known interface that supports late binding and allows applications written in languages that do not support direct vtable access such as LabView and VEE to use the Invokeo method of the IDispatch interface to call methods in the object. The inclusion of the IDispatch interface is required if the universal I/O interface 30 needs to support dual interfaces. The IComponent interface 38b is used to obtain I/O hardware component information. The IIO interface 38c is the main substantive API for the universal I/O interface 30. It includes universal functions for connection to, initialization, and access to the underlying hardware architecture, and includes universal read and write functions for reading and writing data in a language independent manner. Universal I/O interface COM object 35 preferably also implements one of a GPIB interface IIOGPIB, an RS-232 interface IIORS232, or a VXI interface IIOVXI to support data transport over any one of these user selectable I/O buses.

In addition, as known by those skilled in the art to be required of all COM objects, COM object 35 specifies a universal interface IUnknown. The standard IUnknown interface 36 defines a QueryInterface( ) method, an AddRef( ) method, and a Release( ) method. The QueryInterface( ) method takes the interface identifier IID of the desired custom interface and a pointer parameter, and returns a pointer to the new interface pointer in the pointer parameter. When it performs a QueryInterface( ), the QueryInterface( ) method automatically calls the AddRef( ) method, which increments the reference count of the number of interface pointers to the universal I/O interface COM object 35 that are currently in use. The Release( ) method is called by the user of an interface pointer when the user is finished using the interface to release it, causing the reference count to be decremented. Accordingly, the QueryInterface( ) method of the IUnknown interface 36 provides access to each of the other custom interfaces 38a, 38b, . . . , 38n.

Figure 4:
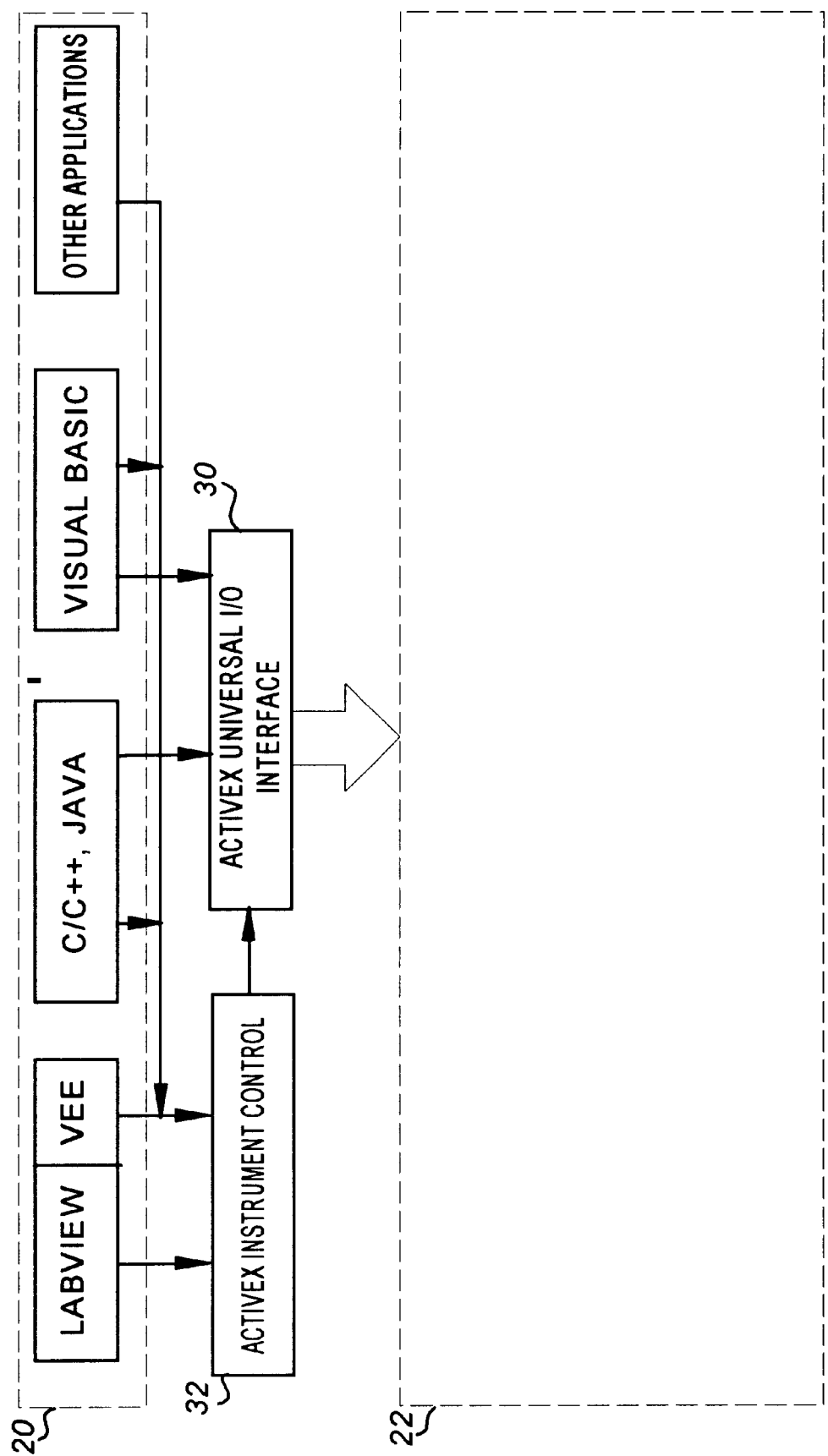
FIG. 4 is an I/O model diagram illustrating the universal I/O interface of the invention within the model of FIG. 2.

FIG. 4 is an I/O model diagram illustrating the universal I/O interface 30 of the invention within the model of FIG. 2. As illustrated, all communication between the user interface language 20 and the I/O function 22 is through the universal I/O interface 30, either directly or indirectly via an ActiveX instrument control 32.

Universal I/O interface 30 comprises an ActiveX Universal I/O Automation Server, which may be called via a variety of user interface languages, including C, C++, Java, Visual Basic, and many others. As known by those skilled in the art, ActiveX Automation Servers by definition support dual interfaces, including custom vtable-based access interfaces such as the IIO interface 38b and the well-known IDispatch interface which supports method invocation for applications written in languages that do not support vtable access. Thus, implementing the universal I/O interface 30 as an ActiveX Universal I/O Automation Server allows any language that can support vtable access to access the methods directly via the vtable. Languages that support late binding can invoke the methods via the Invoke( ) method of the IDispatch interface. Thus, because it supports a dual interface, the universal I/O interface 30 supports a wide variety of languages and object containers which includes a variety of Microsoft desktop applications and Web browsers.

Some user interface languages, such as LabView or VEE communicate with the instrument via an instrument driver. In this case, an ActiveX Instrument Control 32 is provided for communicating indirectly with universal I/O interface 30.

Figure 5:
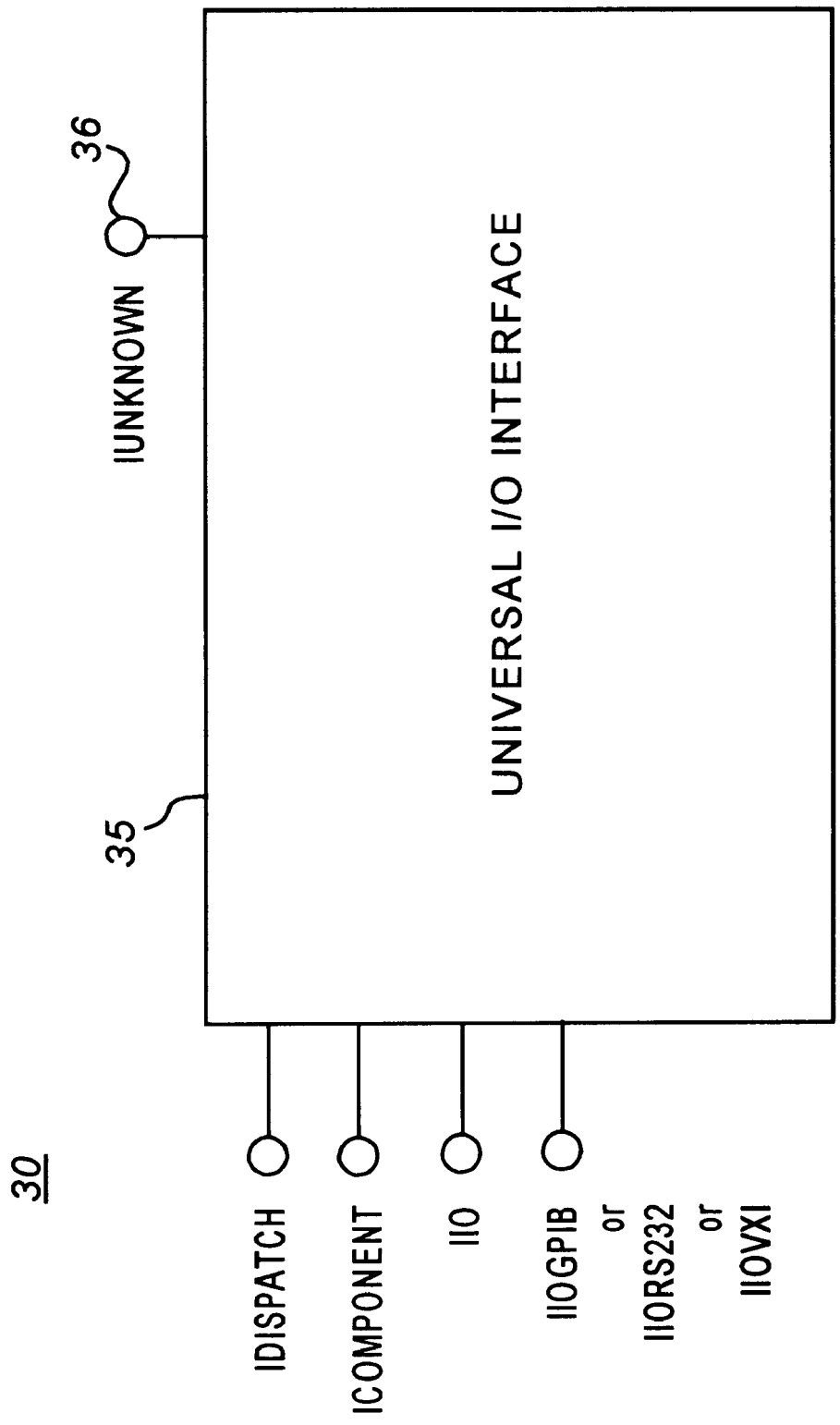
FIG. 5 is a COM object diagram of the preferred embodiment of universal I/O interface COM object.

FIG. 5 is a COM object diagram of the preferred embodiment 60 of universal I/O interface COM object 35 IIO. In the preferred embodiment, universal I/O interface COM object 35 IIO supports an interfaces IDispatch 38a, IComponent 38b, and IIO 38c. Interface IIO 38c includes methods Read( ) and Write( ) that return objects that implement the IRead and IWrite interfaces. The Read( ) and Write( ) methods are used to respectively read data from and write commands to a device. ActiveX Universal I/O Automation Server 35 also includes one of interfaces IIOGPIB, IIORS232, or IIOVXI to allow the configuration and control of selected underlying I/O buses, including respectively the well-known GPIB, RS-232, and VXI I/O busses and associated controllers.

Appendix A is an illustrative embodiment of the Interface Definition Language (IDL) source code for implementation of the universal I/O interface 30 and instrument control interface 32. In this example, an interface IComponent specifies the interface used for retrieving the underlying I/O hardware manufacturer (method ComponentManufacturer( )), its description (method ComponentDescription( )), version (method ComponentVersion( )), and ID (method ComponentProgID( )). It also defines a method (method LogInterface( )) for specifying whether a client's log sink is to be invoked via a client supplied connection point when certain events occur. Method InstanceName( ) sets and/or retrieves the name of an instance of the universal I/O interface object.

Another interface, IInitialize, specifies a set of methods for initializing a universal I/O interface object. It includes methods for initializing the object (Initialize( )), loading a set of properties associated with the object (LoadPropertyBag( )), setting and saving a set of properties associated with the object (SavePropertyBag( )), and retrieving the current set of properties associated with the object (InitializationProperties( )).

A log interface ILog is also provided which specifies a method WriteLog( ) used for logging events.

Appendix B is an illustrative embodiment of the IDL source code for implementation IIO of the universal I/O interface 30. In this example, IIO specifies an interface IFields which provides a collection of methods for parsing data, including method Item( ) which sets the current index in the current data block from which to retrieve data, a method Separator( ) which sets and/or gets the current data separator character(s), a Count( ) method which returns the number of data items in the current data block, a method Type( ) which sets and/or gets the current data type, a method Swap( ) which sets and/or retrieves the current byte order format (Big Endian or Little Endian), and a method NextBlock which sets the current data pointer to the beginning of the next data block.

Universal I/O interface IIO includes a method Read( ) and a method Write( ) that respectively return an object that implements the IRead( ) interface and an object that implements the IWrite( ) interface. The IRead( ) interface and IWrite( ) interface have methods and properties that are respectively used to read data from and write commands to a device. The IRead interface includes methods Data( ) for retrieving data from a device, method Fields( ) that returns an object that implements the IFields interface which includes methods for retrieving the current set of fields used to parse the data (including the current index, separator character(s), data type, etc.), and method SetBuffer( ) for specifying the blocksize of the data to read. The IWrite interface includes methods Command( ) for specifying a command to output to the device, CommandSeparator( ) for setting and/or retrieving the current command separator character(s), Argument( ) for inputting a command argument, ArgumentSeparator( ) for setting and/or retrieving the current command argument separator character(s), and Send( ) which causes the command and arguments, if any, to be sent to the I/O device of the instrument.

Universal I/O interface IIO includes an interface IComponent which includes methods for finding (Fin( )), determining whether a connection name is acceptable (CanHandleConnectionName( )), connection to (Connect( )) and initialization of (Initialize( )) a particular device, device locking (DeviceLock( )) and unlocking (DeviceUnlock( )), retrieving the particular I/O type of a particular device (IOType( )), setting and/or retrieving the current data buffer size (BufferSize( )),reading (Read( )) and writing (Write( )), stream reading (ReadBytes( )) and writing (WriteBytes( )) with capability of setting and/or retrieving the current read or write terminator character(s) (ReadTerminator( ) and WriteTerminator( )) and timeout values (Timeot( )) between issuing a read or write command and receiving data and/or status back from the device.

Universal IIO interface IIO optionally includes one of a set of interfaces IIOGPIB, IIORS232, and IIOVXI that allow the configuration and control of selected underlying I/O bus, including respectively the well-known GPIB, RS-232, and VXI I/O busses and associated controllers. Each of the IIOGPIB, IIORS232, and IIOVXI interfaces inherit all of the methods defined in interface IComponent described above.

In addition, the IIOGPIB I/O interface defines methods specific to the well-known GPIB architecture. These methods include functions for enabling, disabling, discarding and/or allowing waiting on interrupts (EnableInterrupt( ), DisableInterrupt( ),DiscardInterrupts( ), and/or WaitOnInterrupt( )), enabling, disabling and allowing waits on service request interrupts ((EnableSRQ( ), DisableSRQ( ), WaitOnSRQ( )), setting and/or retrieving the attention line ATN state (ATN( )), setting and/or retrieving the remote enable line REN state (REN( )), setting and/or retrieving the primary and secondary bus address (PrimaryAddress( ) and SecondaryAddress( )), retrieving the status of automatic serial polling (SerialPoll( )), sending trigger commands to devices that support triggering (Trigger( ), BusTrigger( )), setting and/or retrieving the current GPIB board number (if the test system includes multiple GPIB cards), retrieving the GPIB status information (GPIBStatus( )), setting or retrieving the automatic error checking which determines whether or not each write command to the device is received properly (AutoCheckErrors( )), locking and unlocking the GPIB bus (GPIBLock( ) and GPIBUnlock( )), setting the state of the GPIB bus to the remote, local, or local with lockout state (Remote( ), Local( ), LocalLockout( )), sending a bus management command to the GPIB bus (SendCommand( )), setting or retrieving the current delay time between received characters (T1Delay( )), and passing the controller in charge to another specified device on the GPIB bus (PassControl( )).

In addition to the methods defined by the IComponent interface, the IIORS232 I/O interface defines additional methods specific to the well-known RS-232 interface. These methods include functions for setting and/or retrieving the current baudrate (BaudRate( )), character size (CharacterSize( )), communication port (COMPort( )), data transmit line DTR state (DTR( )), duplex state (Duplex( )), handshake mode (Handshake( )), parity (Parity( )), RTS line state (RTS( )), and stop bits (StopBits( )). It also provides methods for enabling, disabling, discarding and allowing waiting on interrupts (EnableInterrupt( ), DisableInterrupt( ), DiscardInterrupt( ), WaitOnInterrupt( )), and query bus information and modem status (RS232Status( ) and ModemStatusLines( )).

In addition to the methods defined by the IComponent interface, the IIOVXI I/O interface defines additional methods specific to the well-known VXI I/O hardware. These methods include functions for disabling, enabling, discarding and allowing waiting on interrupts (DisableInterrupt( ), EnableInterrupt( ), DiscardInterrupts( ), WaitOnInterrupt( )), enabling, discarding, and allowing waiting on service requests (EnableSRQ( ), DiscardSRQs( ), WaitOnSRQ( )), setting up or retrieving the configuration of the VXI trigger lines (TriggerLines( ), GetTriggerRoute( ), TriggerRoute( ), setting the default VME Access Modifiers for the mapped regions (AccessModifier( )), specifying or retrieving the byte order of memory being mapped (ByteOrderMapped( )), specifying the byte order of memory that the current device shares (ByteOrderSource( )), obtaining a list of VME lines that this device handles when asserted (HandlerList( )), obtaining a list of VME lines that the current device asserts when it needs service (InterruptList( )), setting or retrieving the VXI logical address of the current device (LogicalAddress( )), limiting bus access by methods that affect the entire bus (VXILock( ), VXIUnlocko( )), retrieving the VXI status information (VXIStatus( )), and sending a word serial command to a specific device (WordSerialCommand( )).

Universal I/O interface IIO also includes an interface IRegisterIO which defines methods for register based devices (i.e., those that include only the minimum required VXI configuration registers). Interface IRegisterIO inherits all the methods of IComponent and additionally defines methods for sending raw or block data to and receiving raw or block data from a device (Write8, Write16, Write32, Write64, Write8, BlockIn16, BlockIn32, BlockIn64, Read8, Read16, Read32, Read64, BlockOut8, BlockOut16, BlockOut32, BlockOut64), setting and retrieving register contents (Poke8, Poke16, Poke32, Poke64, Peek8, Peek16, Peek32, Peek64), setting and retrieving the contents of memory configuration registers (Memory8( ), Memory16( ), Memory32( ), Memory64( )), and mapping or unmapping a VME address space.

The universal I/O interface IIO also specifies a VXI specific interface IRegisterVXI for register-based VXI devices. IRegisterVXI inherits all of the methods of IRegisterIO and also supports VXI-specific methods AccessModifier( ), ByteOrderMapped( ), ByteOrderSource( ), DisableInterrupt, EnableInterrupt( ), DiscardInterrupts( ), WaitOnInterrupt( ), DisableSRQ( ), EnableSRQs, DiscardSRQs, WaitOnSRQs, GetTriggerRoute( ), TriggerRoute( ), TriggerLines( ), HandlerList( ), InterruptList( ), LogicalAddress, VXILock( ), VXIStatus( ), and VXIUnlock similar to the IIOVXI interface.

Universal I/O interface IIO specifies an IIOEvents dispinterface to expose certain services to clients. These dispinterface methods are used by clients that set up a connection point to client-implemented sink routines that are invoked upon the occurrence of some event. For example, if a client is to be notified on each occurrence of a service request interrupt, it passes a client-implemented sink routine pointer to the SRQ( ) method which causes the sink to be invoked each time a service request interrupt occurs. Similar dispinterface methods include Error( ), Trace( ), and BusInterrupt( ) which respectively invoke a client sink upon the occurrence of a bus error, a trace instruction, and a bus interrupt respectively.

Appendix C is an illustrative embodiment of the IDL source code for generating a type library for the universal I/O interface 30 IIO. In this example, library HPIOLib includes component class definitions for objects including HPGPIB, HPGIPBInit, HPRS232, HPRS232Init, HPVXI, and HPVXIInit. Component class HPGPIB supports as a default interface the IIOGPIB interface defined in Appendix B. It also supports the IIO and IComponent interfaces specified in Appendix B, along with dispinterfaces IIOEvents and ILog, found respectively in Appendix B and Appendix A. Component class HPGPIBInit supports as a default interface IInitialize. Component class HPRS232 supports as a default interface the IIORS232 interface defined in Appendix B. It also supports the IIO and IComponent interfaces, along with dispinterfaces IIOEvents and ILog. Component class HPRS232Init supports as a default interface initialize. Component class HPVXI supports as a default interface the IIOVXI interface defined in Appendix B. It also supports the IIO and IComponent interfaces, along with dispinterfaces IIOEvents and ILog. Component class HPVXIInit supports as a default interface IInitialize.

Appendix D is the IDL source code for a set of utility interfaces, including interface IIOManager which is used to discover I/O ports and instruments, interface IIOs which is an array of IIO interfaces called a collection that is used in Visual Basic, IEnumIO which is another type of collection that is used in C++, and IIOFile which uses files for I/O instead of an I/O port which is useful in simulations and testing.

The IDL source code in Appendices A through D is the definition for the actual function code (not shown) for each of the methods and properties specified by the interfaces. The IDL is compiled using an IDL compiler to create a universal I/O interface type library. The type library contains a set of COM interface definitions that are available to application programmers to utilize as necessary and appropriate to their particular instrument control application. The universal I/O interface type library effectively hides the details of the underlying I/O hardware API from the user and remains the same regardless of the language the application is written in.

In the preferred embodiment, since the universal I/O interface 30 is an ActiveX Automation Server, it is readily insertable into a variety of applications, (e.g., Microsoft's Visual Basic for Applications (VBA)) for use in controlling the flow of data. Since the universal I/O interface 30 in the preferred embodiment also embodies a type library, its methods, properties and parameters can be easily displayed using Visual Basic.

ActiveX controls are based on the Microsoft's Component Object Module (COM) technology. To be considered an ActiveX object, the COM object only needs to support self-registration and automation (also called OLE Automation or a Dispatch Interface).

Each ActiveX Universal I/O Automation Server must register with a component category in the operating system registry to allow other programs to determine whether they can correctly use it. The component category for the ActiveX Universal I/O Automation Server is defined by a globally unique identifier (GUID) called a CATID. In the illustrative embodiment, the CATID of the ActiveX Universal I/O Automation Server is defined as:

```
//
//String to be associated with the ActiveX Universal IIO
    Automation //Servers.
WCHAR* IIO="ActiveX Universal IO Automation
    Server";
//
//This is the Globally Unique Category Identifier for the
    ActiveX
//Universal IO Automation Server.
// {B6D4A4CF-BABE-FACE-B53E-080009F8D414}
CATID CATID_IIO_ =
{0xb6d4a4cf- 0xbabe, 0xface, {0xb5, 0x3e, 0x8, 0x0,
    0x9, 0xf8, 0xd4, 0x14 }};
```

Figure 6A:
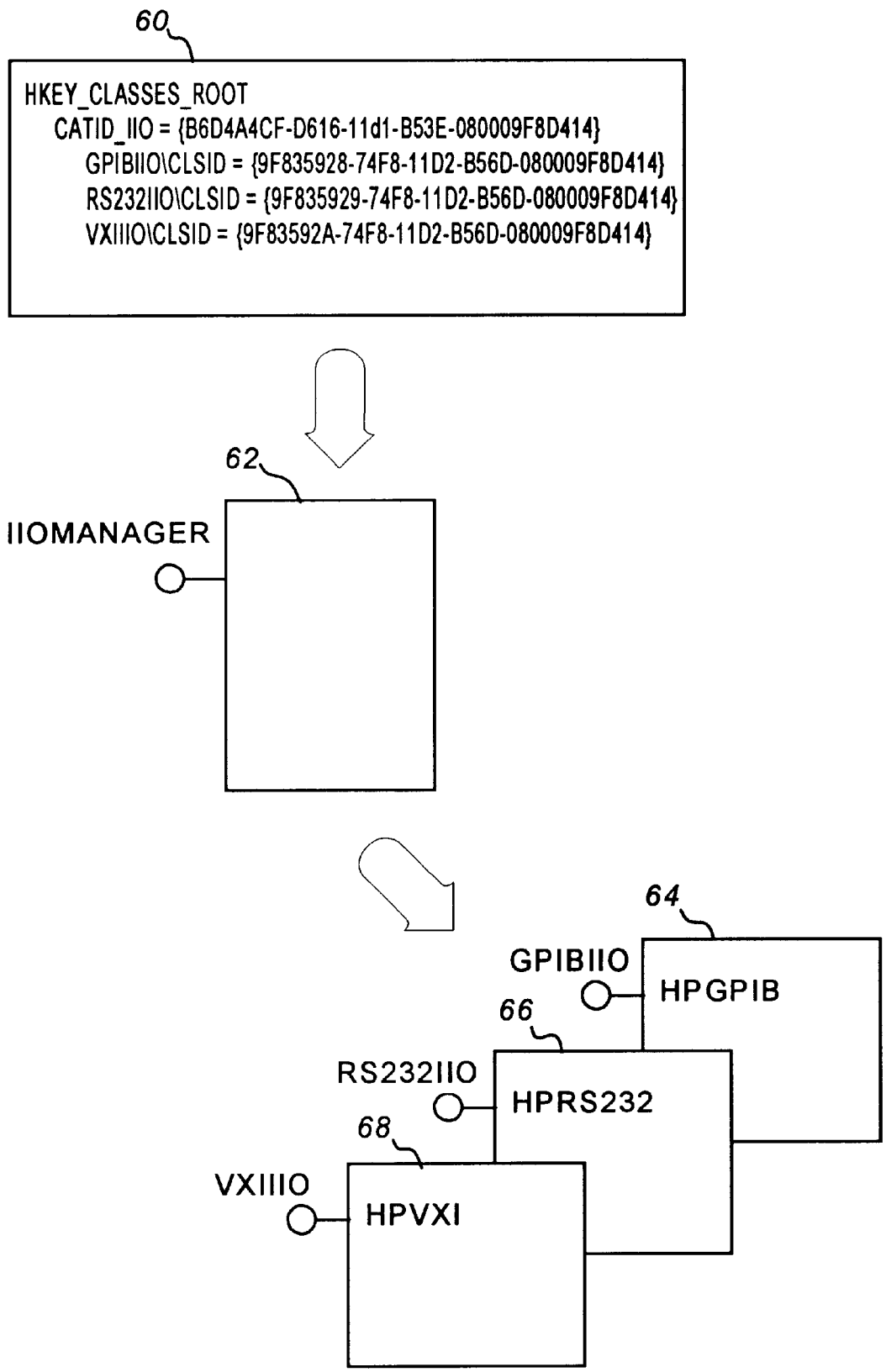
FIG. 6(*a*) is an object diagram illustrating an object that supports the IIOManager interface and its relation to the system registry and available IIO servers.
Figure 6B:
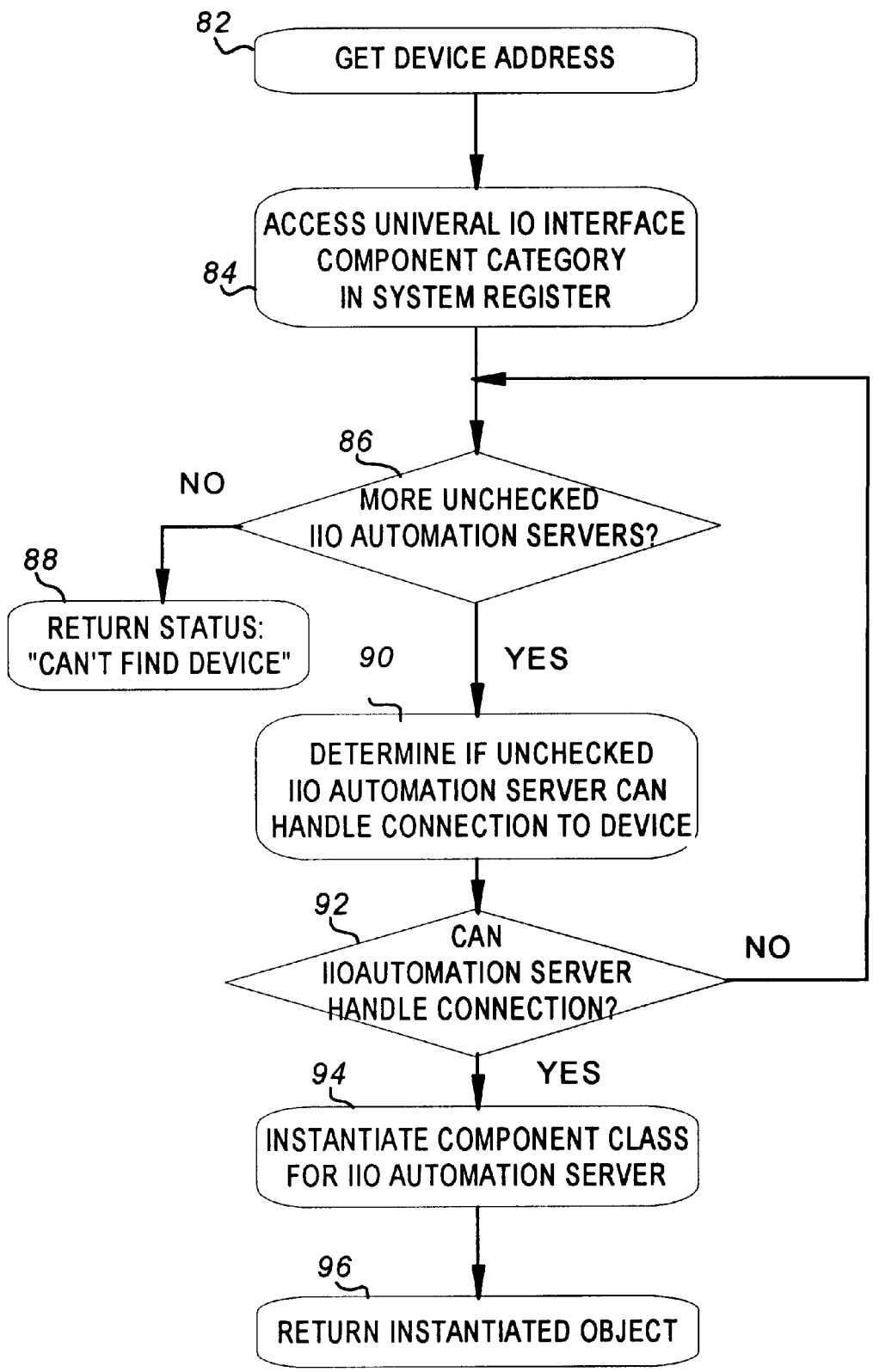

The IIO component category allows the IIOManager interface to be able to find all IIO automation servers, and instantiate them to determine if it is the correct server for supporting a given device address. FIG. 6(a) is a diagram illustrating an object 62 that supports the IIOManager interface and its relation to the system registry 60 and available IIO servers GPIBIIO 64, RS232IIO 66, and VXIIIO 68. FIG. 6(b) is an operational flowchart of a method for determining which of, and instantiating, an ActiveX Universal IO Automation Server IIO supports a test system's underlying I/O hardware. In the preferred embodiment, this achieved by calling the ConnectToInstrument( ) method of an object 62 that supports the IIOManager interface. The address of the device is selected 80, and in the preferred embodiment is an input parameter to IIOManager.ConnectToInstrument (<address>). The system registry 60 is accessed to obtain each component class that supports component category for the ActiveX Universal I/O Automation Server IIO. If any IIO component classes (e.g., HPGPIB, HPRS232, HPVXI) have not been checked for ability to connect to the specified device, as determined in step 86, one of the available unchecked component classes is selected and it is determined 90 whether the selected component class can connect to the device specified by the address. If the selected component class can handle the connection to the device, as determined in step 92, the component class of the IIO automation server is instantiated 94, and the instantiated object is returned 96. If the IIO automation server cannot handle the connection, it is determined 86 whether any component classes remain unchecked, and steps 90 through 92 are repeated if an available component class still remains unchecked for ability to connect to the device. If no remaining component classes remain to check for ability to connect to the device, a status of "Can't Find Device" is returned 88 to the caller.

An implementation example of the code used to accomplish this in Visual Basic is:

```
Dim manager as new IIOManager
Dim arb as IIO
set arb=manager.ConnectToInstrument("GPIBO::4")
```

ActiveX Universal I/O Automation Server Write( ) returns an object that implements the IWrite interface.

Interface IWrite includes a default method called Command( ), which takes two parameters including a String and a Boolean. A programming example of its use in Visual Basic is:

```
Dim manager as new IIOManager
Dim arb as IIO
set arb=manager.ConnectToInstrument("GPIBO::4")
Arb.Write "*IDN?"
```

In this example, an IIOManager object "manager" is created. A variable "arb", which can hold an IIO object, is created. The variable "arb" is then set to the IIO object that is returned by the ConnectToInstrument( ) method of the IOManager. The Write( ) method of the IIO object called "arb" is then invoked to send the command string "*IDN?" to the device at address "GPIBO::4". Since the default method of interface IWrite is Command( ), method Command( ) is called with String "*IDN?" as the input command parameter and a default boolean value of TRUE as the second parameter. The second parameter instructs the IWrite interface to flush the command and any arguments. A more complicated Visual Basic command implementation is as follows:

```
Dim UpperRange, LowerRange as Double
Dim digits as Integer
UpperRange=0.01
LowerRange=0.0001
Digits=6
With arb.Write
    .Command "Meas:Res?", False
    .Argument(1)=UpperRange;
    .Argument(2)=LowerRange;
    .Argument(3)=Digits;
    .Send( )
End With
Output: ":Meas:Res? 0.01, 0.0001, 6"
```

The IWrite interface allows several commands to be queued up before they are sent, thereby allowing more efficient use of available bandwidth. The following is an example:

```
With arb.Write
    .Command "*CLS",False
    .Command "*RST",False
    .Command "Meas:Volt?"
End With
Output: "*CLS;*RST;Meas:Volt?"
```

Methods CommandSeparator( ) and ArgumentSeparator( ) allow the command and argument separators, which respectively default to the semicolon character and comma character, to be changed.

Read( ) reads the data from a device until a terminator has been detected. It then returns an object that implements the IRead interface. The default method of interface IRead is method Data( ) which returns the data as a String. If more parsing of the data is desired, an IFields interface pointer can be obtained by invoking IRead.Fields( ). The IFields interface will parse a comma-separated list, or IEEE 488.2 definite/indefinite length blocks. A couple of Visual Basic implementation examples of the use of IRead( ) is illustrated below.

```
Dim getIO as New IIOManager
Dim Scope as IIO
Dim result as String
Set Scope=getIO.ConnectToInstrument("Scope")
Scope.Write "*IDN?"
Scope.Read result
'Example of using the default method of Write's
'IWrite interface to send Strings.
    Scope.Write "WAVEFORM:BYTEORDER LSBF"
    Scope.Write "WAVEFORM:FORMAT WORD"
    Scope.Write "WAVEFORM: DATA?"
'After reading the data set the Type of data to
'IEEE Block of short integers, then the data can
'be accessed as an array of integers
With Scope.Read.Fields
    Dim I as Integer
    .Type=InstrumentI_IEEEBlockToShort
    For I=0 to .Count−1
        Debug.Print .Item(I)
    next I
End With
```

It will be appreciated from the above detailed description that the universal I/O interface of the invention improves over the prior art in several ways. First, it provides a universal abstraction of the underlying I/O bus and supporting software libraries without requiring the user/client to learn the specific APIs unique to the selected IIO solution. It allows communication with a plurality of different underlying I/O buses. It also provides a mechanism for adding new universal I/O interface servers at any time to support new busses as they are introduced into the market.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A universal I/O interface apparatus for allowing communication with instrumentation over a plurality of different underlying I/O configurations, comprising:
    a plurality of methods;
    a plurality of I/O interfaces each of which specifies a set of said plurality of methods for supporting a particular one of said plurality of different underlying I/O configurations;
    a system registry comprising a plurality of component classes that supports a component category associated with one or more of said plurality of I/O interfaces;
    a device connection function which receives a device address of a device, accesses said system registry, selects one of said plurality of component classes that supports said component category and can handle connection to said device address, and instantiates an object of said selected component class.

2. A universal I/O interface apparatus in accordance with claim 1, wherein:
    said plurality of methods and said plurality of I/O interfaces is embodied in a type library, said type library comprising a set of interface definitions that interface to a plurality of I/O hardware application programming interfaces (APIs).

3. A universal I/O interface apparatus in accordance with claim 1, wherein:
    said plurality of methods and said plurality of I/O interfaces is embodied in a Component Object Module (COM) object.

4. A universal I/O interface apparatus in accordance with claim 3, wherein:
    said COM object is an ActiveX Universal I/O Automation Server.

5. A universal I/O interface apparatus in accordance with claim 1, comprising:
    a parsing function which reads data from said selected one of said plurality of different underlying I/O configurations and parses said data into constituent parts.

6. A universal I/O interface apparatus in accordance with claim 1, wherein:
    said universal IIO interface comprises:
    a write function which formats instrument commands into a command string and writes said command string to said selected one of said plurality of different underlying I/O configurations.

7. A universal I/O interface apparatus in accordance with claim 1, wherein:
    said plurality of I/O interfaces comprises a General Purpose Interface Bus (GPIB) interface comprising:
    a plurality of methods for supporting control of a GPIB interface.

8. A universal I/O interface apparatus in accordance with claim 1, wherein:
    said plurality of I/O interfaces comprises a VME extension Interface (VXI) interface comprising:
    a plurality of methods for supporting control of a VXI interface.

9. A universal I/O interface apparatus in accordance with claim 1, wherein:
    said plurality of I/O interfaces comprises an RS-232 interface comprising:
    a plurality of methods for supporting control of an RS-232 interface.

10. A method for allowing communication with instrumentation over a plurality of different underlying I/O configurations, said method comprising the steps of:
    obtaining a device address of a selected device;
    accessing a system registry to select a component class that supports a component category associated with a universal I/O interface, said universal I/O interface comprising a plurality of methods and a plurality of I/O interfaces each of which specifies a set of said plurality of methods for supporting a particular one of said plurality of different underlying I/O configurations;
    determining whether said selected component class can handle connection to said device address;
    if said selected component class can handle said connection to said device address:
        instantiating an object of said component class; and
        returning said instantiated object;
    if said selected component class cannot handle said connection to said device address:
        accessing said system registry to determine whether another component class that supports said component category associated with said universal I/O interface exists; and
        repeating said determining step through said repeating step if said another component class exists.

11. The method of claim 10, comprising:

invoking methods on said instantiated object to communicate with said selected device.

12. A computer readable storage medium tangibly embodying program instructions for performing a method for communicating with instrumentation over a plurality of different underlying I/O configurations, said method comprising:

obtaining a device address of a selected device;

accessing a system registry 60 to select a component class that supports a component category associated with a universal I/O interface, said universal I/O interface comprising a plurality of methods and a plurality of I/O interfaces each of which specifies a set of said plurality of methods for supporting a particular one of said plurality of different underlying I/O configurations;

determining whether said selected component class can handle connection to said device address;

if said selected component class can handle said connection to said device address:

instantiating an object of said component class; and returning said instantiated object;

if said selected component class cannot handle said connection to said device address:

accessing said system registry to determine whether another component class that supports said component category associated with said universal I/O interface exists; and repeating said determining step through said repeating step if said another component class exists.

13. The method of claim 13, comprising:

invoking methods on said instantiated object to communicate with said selected device.

* * * * *

UNITED STATES PATENT AND TRADEMARK OFFICE
CERTIFICATE OF CORRECTION

PATENT NO. : 6,389,491 B1
DATED : May 14, 2002
INVENTOR(S) : Eric Micheal Jacobson, Paul Faust It is certified that error appears in the above-identified patent and that said Letters Patent is hereby corrected as shown below:

Column 4,
Line 22, delete "Invokeo" and insert -- Invoke( ) --

Column 6,
Line 27, delete "(Fin( ))" and insert -- (Find ( )) --
Line 38, delete "(Timeot( ))" and insert -- (Timeout( )) --
Line 41, delete "Universal IIO" and insert -- Universal I/O --

Column 7,
Line 45, delete "VXIUnlocko( ))" and insert -- VXIUnlock( ) ) --

Column 8,
Line 9, delete "I10Events" and insert -- IIOEvents --

Column 11,
Line 19, delete "Instrument I" and insert -- Instrument IO --

Column 12,
Line 17, delete "IIO" and insert -- I/O --

Signed and Sealed this

First Day of June, 2004

JON W. DUDAS
*Acting Director of the United States Patent and Trademark Office*